(12) United States Patent
Bedell et al.

(10) Patent No.: US 8,709,914 B2
(45) Date of Patent: Apr. 29, 2014

(54) METHOD FOR CONTROLLED LAYER TRANSFER

(75) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 484 days.

(21) Appl. No.: 13/159,893

(22) Filed: Jun. 14, 2011

(65) Prior Publication Data
US 2012/0322227 A1 Dec. 20, 2012

(51) Int. Cl.
*H01L 21/30* (2006.01)
*H01L 21/46* (2006.01)

(52) U.S. Cl.
USPC ............ 438/458; 257/E21.211; 257/E21.568; 257/E21.57

(58) Field of Classification Search
USPC .................. 438/458; 257/E21.211, E21.568, 257/E21.57
See application file for complete search history.

(56) References Cited

U.S. PATENT DOCUMENTS

| 2007/0249140 | A1 | 10/2007 | Dross et al. |
| 2010/0310775 | A1 | 12/2010 | Bedell et al. |
| 2010/0311250 | A1 | 12/2010 | Bedell et al. |
| 2010/0323472 | A1 * | 12/2010 | Dross et al. ..................... 438/96 |

OTHER PUBLICATIONS

Search and Examination Report dated Nov. 21, 2012, issued by the U.K. Intellectual Property Office, received in a corresponding foreign application.

* cited by examiner

*Primary Examiner* — Calvin Choi
(74) *Attorney, Agent, or Firm* — Scully, Scott, Murphy & Presser, P.C.; Louis J. Percello, Esq.

(57) ABSTRACT

A method of controlled layer transfer is provided. The method includes providing a stressor layer to a base substrate. The stressor layer has a stressor layer portion located atop an upper surface of the base substrate and a self-pinning stressor layer portion located adjacent each sidewall edge of the base substrate. A spalling inhibitor is then applied atop the stressor layer portion of the base substrate, and thereafter the self-pinning stressor layer portion of the stressor layer is decoupled from the stressor layer portion. A portion of the base substrate that is located beneath the stressor layer portion is then spalled from the original base substrate. The spalling includes displacing the spalling inhibitor from atop the stressor layer portion. After spalling, the stressor layer portion is removed from atop a spalled portion of the base substrate.

24 Claims, 4 Drawing Sheets

METHOD FOR CONTROLLED LAYER TRANSFER

BACKGROUND

The present disclosure relates to semiconductor device manufacturing, and more particularly, to a method for controlled layer transfer utilizing a self-pinning stressor layer portion of a stressor layer which is formed near the edges of a base substrate.

Surface layer removal from brittle substrates using controlled spalling technology is promising to be a powerful method for changing the cost structure of high-efficiency photovoltaic materials, as well as enabling new features in a range of semiconductor technologies (e.g., flexible photovoltaics, flex circuits and displays). Cornerstone to this technology is the application of a tensile stressor layer on the surface of a base substrate to be spalled. The tensile stressor layer has a combined thickness and stress that is sufficient to induce spalling mode fracture in the base substrate. Such a spalling process is disclosed, for example, in U.S. Patent Application Publication No. 2010/0311250 to Bedell et al.

Experimentation in spalling seems to indicate that it is a critical phenomenon; given a sufficiently high thickness and stress value in the tensile stressor layer, spalling mode fracture occurs spontaneously. There is, however, a reasonably large process window of metastability. Stressor thickness and stress combinations that are unstable against spalling mode fracture will be "nucleation-" or "initiated-limited".

Handling layers that are applied to the surface of the stress/substrate combination are then used to control the initiation and fracture propagation leading to the removal of continuous surface layers from the base substrate.

SUMMARY

The present disclosure relates to a method which can arrest the spalling mode of fracture, as well as increase the metastability of the stressor/substrate combination. By deliberately arresting the possibility of spontaneous spalling mode fracture until such a time when it can be conducted under controlled conditions, the usable process window for this technology is increased which tends to reduce material loss as a result of wafer breakage or premature (i.e., uncontrolled) spalling. Also, the method of the present disclosure allows layer transfer to occur arbitrarily close to an edge of a base substrate.

In the present disclosure, a stressor layer including a stressor layer portion and a self-pinning stressor layer portion is employed. The stressor layer portion which is formed atop an upper surface of a base substrate has a critical thickness and stress value that cause spalling mode fracture to occur within the base substrate. The self-pinning stressor layer portion which is present near an edge of the base substrate has a sub-critical thickness and stress value. Since the self-pinning stressor layer portion is below the critical thickness and stress value needed to cause spalling mode fracture to occur, the self-pinning stressor layer portion remains pinned to the edges of the base substrate. As such, the self-pinning stressor layer portion holds the stressor layer portion down atop the upper surface of base substrate by the strength of the stressor material. This arrests the possibility of spontaneously spalling mode fracture until such a time when it can be conducted under controlled conditions. The stressor layer portion is then released from the self-pinning stressor layer portion and spalling occurs under controlled conditions.

In one embodiment of the present disclosure a method of controlled layer transfer is provided. The method includes providing a stressor layer to a base substrate. The stressor layer has a stressor layer portion located atop an upper surface of the base substrate and a self-pinning stressor layer portion located adjacent each sidewall edge of the base substrate. A spalling inhibitor is then applied atop the stressor layer portion of the stressor layer, and thereafter the self-pinning stressor layer portion of the stressor layer is decoupled from the stressor layer portion. A portion of the base substrate that is located beneath the stressor layer portion is then spalled from the original base substrate. The spalling includes displacing the spalling inhibitor from atop the stressor layer portion. After spalling, a stressor layer portion is removed from atop a spalled portion of the base substrate.

DETAILED DESCRIPTION

The present disclosure, which provides a method for controlling spall-mode fracture in a spalling process, will now be described in greater detail by referring to the following discussion and drawings that accompany the present application. It is noted that the drawings are provided for illustrative purposes only and are not drawn to scale. Also, in the drawings like reference numerals are used for describing like elements.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
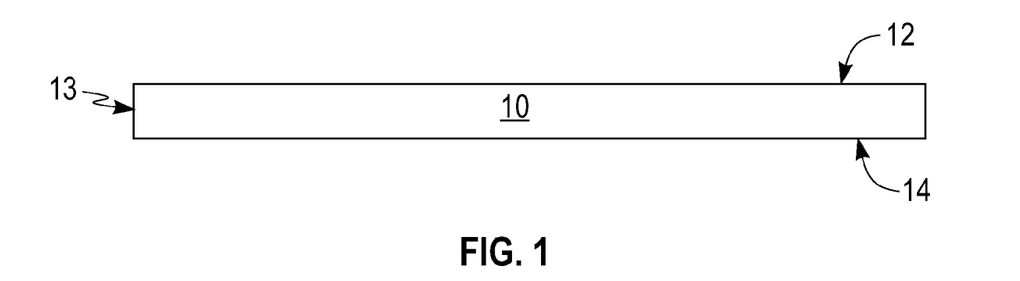
FIG. 1 is a pictorial representation (through a cross sectional view) illustrating an initial base substrate that can be employed in one embodiment of the present disclosure.

Referring first to FIG. 1, there is illustrated a base substrate 10 having an upper (i.e., topmost) surface 12 and a lower (i.e., bottommost) surface 14 that can be employed in the present disclosure. The base substrate 10 also includes sidewall edges 13. The base substrate 10 employed in the present disclosure may comprise a semiconductor material, a glass, a ceramic, or any another material whose fracture toughness is less than that of the stressor layer to be subsequently formed.

Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

When the base substrate 10 comprises a semiconductor material, the semiconductor material may include, but is not limited to, Si, Ge, SiGe, SiGeC, SiC, Ge alloys, GaSb, GaP, GaAs, InAs, InP, and all other III-V or II-VI compound semiconductors. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators.

When the base substrate 10 comprises a semiconductor material, the semiconductor material can be doped, undoped or contain doped regions and undoped regions.

In one embodiment, the semiconductor material that can be employed as the base substrate 10 can be single-crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the base substrate 10 can be amorphous (i.e., a non-crystalline material that lacks the long-range order characteristic of a crystal). Typically, the semiconductor material that can be employed as the base substrate 10 is a single-crystalline material.

When the base substrate 10 comprises a glass, the glass can be an $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic is any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, the upper surface 12 of the base substrate 10 can be cleaned prior to further processing to remove surface oxides and/or other contaminants therefrom. In one embodiment of the present disclosure, the base substrate 10 is cleaned by applying to the base substrate 10 a solvent such as, for example, acetone and isopropanol, which is capable of removing contaminates and/or surface oxides from the upper surface 12 of the base substrate 10.

In some embodiments, of the present disclosure, an optional metal-containing adhesion layer (not shown) can be formed on at least the upper surface 12 of base substrate 10 and optionally vertically abutting the sidewall edges 13 of the base substrate 10. The optional metal-containing adhesion layer can be employed in embodiments in which the stressor layer to be subsequently formed has poor adhesion to the material of the base substrate 10. Typically, the optional metal-containing adhesion layer is employed when a stressor layer comprised of a metal is employed.

Figure 2:
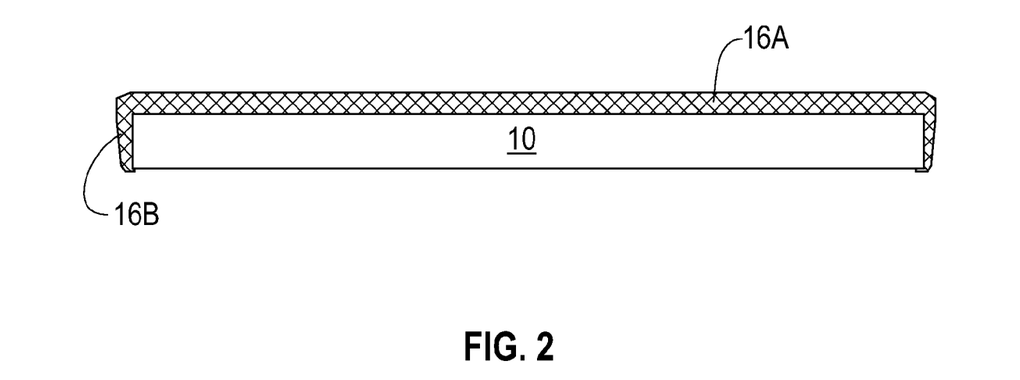
FIG. 2 is a pictorial representation (through a cross sectional view) illustrating the base substrate of FIG. 1 after forming a stressor layer including a stressor layer portion and a self-pinning stressor layer portion thereon.

In FIG. 2 to follow, the optional metal-containing adhesion layer would be present at least between the stressor layer portion 16A and the upper surface 12 of the base substrate 10 and optionally between the self-pinning stressor layer portion 16B and the sidewall edges 13 of the base substrate 10.

The optional metal-containing adhesion layer that can be employed in the present disclosure includes any metal adhesion material such as, but not limited to, Ti/W, Ti, Cr, Ni or any combination thereof. The optional metal-containing adhesion layer may comprise a single layer or it may include a multi-layered structure comprising at least two layers of different metal adhesion materials.

The optional metal-containing adhesion layer can be formed at room temperature (15° C.-40° C.) or above. In one embodiment, the optional metal-containing adhesion layer is formed at a temperature which is from 20° C. to 180° C. In another embodiment, the optional metal-containing adhesion layer is formed at a temperature which is from 20° C. to 60° C.

The optional metal-containing adhesion layer can be formed utilizing deposition techniques that are well known to those skilled in the art. For example, the optional metal-containing adhesion layer can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer typically has a thickness of from 5 nm to 200 nm, with a thickness of from 100 nm to 150 nm being more typical. Other thicknesses for the optional metal-containing adhesion layer that are below and/or above the aforementioned thickness ranges can also be employed in the present disclosure.

Referring to FIG. 2, there is illustrated the structure of FIG. 1 after forming a stressor layer including a stressor layer portion 16A and a self-pinning stressor layer portion 16B. As shown, the stressor layer portion 16A of the stressor layer is located atop the upper surface 12 of base substrate 10, while the self-pinning stressor layer portion 16B may vertically abut the sidewall edges 13 of base substrate 10.

In accordance with the present disclosure, the stressor layer portion 16A that is formed atop upper surface 12 of base substrate 10 has a critical thickness and stress value that cause spalling mode fracture to occur within the base substrate 10. By "spalling mode fracture" it is meant that a crack is formed within base substrate 10 and the combination of loading forces maintain a crack trajectory at a depth below the stressor/substrate interface. By critical condition, it is meant that for a given stressor material and substrate material combination, a thickness value and a stressor value for the stressor layer is chosen that render spalling mode fracture possible (can produce a $K_I$ value greater than the $K_{IC}$ of the substrate).

Specifically, the thickness of the stressor layer portion 16A is chosen to provide the desired fracture depth within the base substrate 10. For example, if the stressor layer portion 16A is chosen to be Ni, then fracture will occur at a depth below the stressor layer portion 16A roughly 2 to 3 times the Ni thickness. The stress value for the stressor layer portion 16A is then chosen to satisfy the critical condition for spalling mode fracture. This can be estimated by inverting the empirical equation given by $t^* = \{(2.5 \times 10^6 (K_{IC}^{3/2})]/\sigma^2$, where $t^*$ is the critical stressor layer thickness (in microns), $K_{IC}$ is the fracture toughness (in units of MPa·m$^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression.

In accordance with the present disclosure, the self-pinning stressor layer portion 16B that may vertically abut each sidewall edge 13 of base substrate 10 has a sub-critical thickness and stress value. According to the above expression, sub-critical stress and thickness values can be estimated by ensuring that one or both of these values are less than 20% of the value predicted by the above expression.

Since the self-pinning stressor layer portion 16B is below the critical thickness and stress value needed to cause spalling mode fracture to occur, the self-pinning stressor layer portion 16B remains 'pinned' i.e., attached, to the edges 13 of the base substrate 10. As such, the self-pinning stressor layer portion 16B holds the stressor layer portion 16A of the stressor layer down atop the upper surface 12 of base substrate 10 by the strength of the stressor material.

In one embodiment, the stressor layer portion 16A and self-pinning stressor layer portion 16B are of unitary construction and are comprised of the same stressor material. In another embodiment, the stressor layer portion 16A and self-pinning stressor layer portion 16B are separate components that can be comprised of different stressor materials.

In accordance with the present disclosure, the stressor layer portion 16A is under tensile stress after decoupling the self-pinning stressor layer portion 16B therefrom, and while present on the base substrate 10 at the spalling temperature.

Illustrative examples of materials that can be employed as the stressor layer portion 16A and the self-pinning stressor layer portion 16B of the stressor layer include, but are not limited to, a metal, a polymer, such as a spall inducing tape layer, or any combination thereof. The stressor layer portion 16A and the self-pinning stressor layer portion 16B of the stressor layer may comprise a single stressor layer, or a multilayered stressor structure including at least two layers of different stressor material can be employed.

In one embodiment, the stressor layer portion 16A and the self-pinning stressor layer portion 16B of the stressor layer are both composed of a metal. In another embodiment, the stressor layer portion 16A and the self-pinning stressor layer portion 16B of the stressor layer are composed of a polymer. In yet another embodiment, the stressor layer portion 16A and the self-pinning stressor layer portion 16B of the stressor layer are composed of a spall inducing tape. In another embodiment, for example, the stressor layer portion 16A and the self-pinning stressor layer portion 16B of the stressor layer may comprise a two-part stressor layer including a lower part and an upper part. The upper part of the two-part stressor layer can be comprised of a spall inducing tape layer.

When a metal is employed as the stressor layer portion 16A and/or the self-pinning stressor layer portion 16B of the stressor layer, the metal can include, for example, Ni, Ti, Cr, Fe or W. Alloys of these metals can also be employed. In one embodiment, the stressor layer portion 16A and the self-pinning stressor layer portion 16B of the stressor layer include at least one layer consisting of Ni.

When a polymer is employed as the stressor layer portion 16A and/or the self-pinning stressor layer portion 16B of the stressor layer, the polymer is a large macromolecule composed of repeating structural units. These subunits are typically connected by covalent chemical bonds. Illustrative examples of polymers that can be employed as the stressor layer portion 16A and the self-pinning stressor layer portion 16B of the stressor layer include, but are not limited to, polyimides, polyesters, polyolefins, polyacrylates, polyurethane, polyvinyl acetate, and polyvinyl chloride.

When a spall inducing tape layer is employed as the stressor layer portion 16A and/or the self-pinning stressor layer portion 16B of the stressor layer, the spall inducing tape layer includes any pressure sensitive tape that is flexible, soft, and stress free at the temperature used to form the tape, yet strong, ductile and tensile at the temperature used during spalling. By "pressure sensitive tape," it is meant an adhesive tape that will stick with application of pressure, without the need for solvent, heat, or water for activation. Tensile stress in the tape at the spalling temperature is primarily due to thermal expansion mismatch between the base substrate 10 (with a lower thermal coefficient of expansion) and the tape (with a higher thermal expansion coefficient).

Typically, the pressure sensitive tape that is employed in the present disclosure as stressor layer portion 16A and/or the self-pinning stressor layer portion 16B of the stressor layer includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer portion 16A and the self-pinning stressor layer portion 16B of the stressor layer employed in the present disclosure are formed at a temperature which is at room temperature (15° C.-40° C.). In another embodiment, when a tape layer is employed, the tape layer can be formed at a temperature which is from 15° C. to 60° C.

When the stressor layer portion 16A and the self-pinning stressor layer portion 16B of the stressor layer are comprised of a metal or polymer, the stressor layer portion 16A and the self-pinning stressor layer portion 16B of the stressor layer can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer portion 16A and the self-pinning stressor layer portion 16B of the stressor layer are comprised of a spall inducing tape layer, the tape layer can be applied by hand or by mechanical means to the structure. The spall inducing tape can be formed utilizing techniques well known in the art or the tape can be commercially purchased from any well known adhesive tape manufacturer. Some examples of spall inducing tapes that can be used in the present disclosure as the stressor layer include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the upper surface 12 and sidewall edges 13 of base substrate 10, wherein a lower part of the two-part stressor layer is formed at a first temperature which is at room temperature or slight above (e.g., from 15° C. to 60° C.), wherein an upper part of the two-part stressor layer comprises a spall inducing tape layer formed at an auxiliary temperature which is at room temperature.

If the stressor layer portion 16A is of a metallic nature, it typically has a thickness of from 3 µm to 50 µm, with a thickness of from 4 µm to 8 µm being more typical. Other thicknesses for a metallic stressor layer portion that are below and/or above the aforementioned thickness ranges can also be employed in the present disclosure. If the self-pinning stressor layer portion 16B is a metal, it typically has a thickness that is below the thickness of the stressor layer portion 16A.

If the stressor layer portion 16A is of a polymeric nature, it typically has a thickness of from 10 µm to 200 µm, with a thickness of from 50 µm to 100 µm being more typical. Other thicknesses for a polymeric stressor layer portion that are below and/or above the aforementioned thickness ranges can also be employed in the present disclosure. If the self-pinning stressor layer portion 16B is a polymer, it typically has a thickness that is below the thickness of the stressor layer portion 16A.

Figure 3:
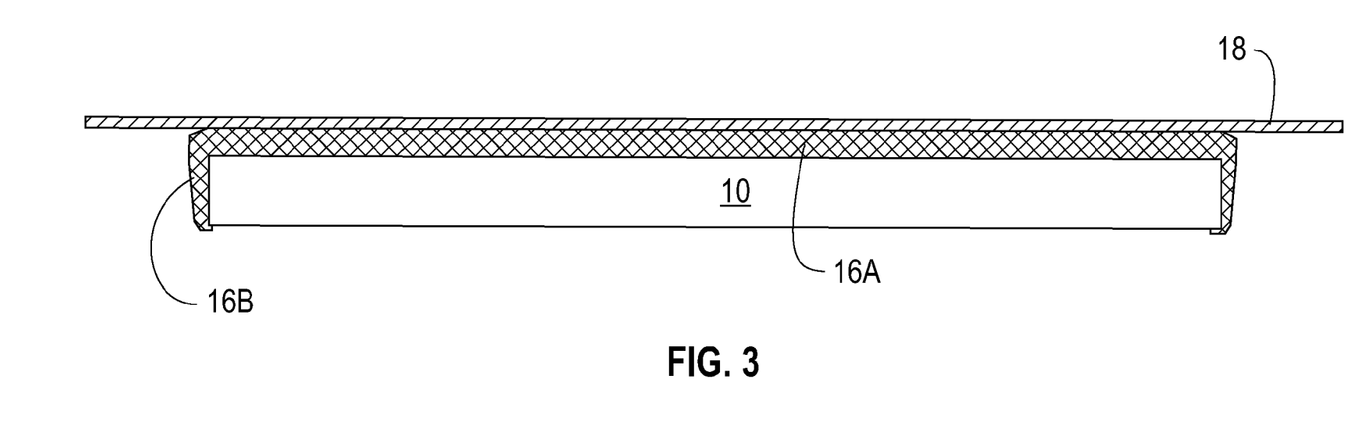
FIG. 3 is a pictorial representation (through a cross sectional view) illustrating the structure of FIG. 2 after forming an optional handle substrate on the stressor layer portion of the stressor layer.

Referring to FIG. 3, there is illustrated the structure of FIG. 2 after forming an optional handle substrate 18 on the stressor layer portion 16A of the stressor layer. The optional handle substrate 18 employed in the present disclosure comprises any flexible material which has a minimum radius of curvature of less than 30 cm. Illustrative examples of flexible materials that can be employed as the optional handle substrate 18 include a metal foil or a polyimide foil. Other examples of flexible materials that can be employed as the optional handle substrate 18 include polymers, tapes and spin-on materials.

The optional handle substrate 18 can be used to provide better fracture control and more versatility in handling the spalled portion of the base substrate 10. Moreover, the optional handle substrate 18 can be used to guide the crack propagation during the spalling process of the present disclosure. The optional handle substrate 18 of the present disclosure is typically, but not necessarily, formed at room temperature (15° C.-40° C.).

The optional handle substrate 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

The optional handle substrate 18 typical has a thickness of from 1 µm to few mm, with a thickness of from 70 µm to 120 µm being more typical. Other thicknesses for the optional handle substrate 18 that are below and/or above the aforementioned thickness ranges can also be employed in the present disclosure.

Figure 4:
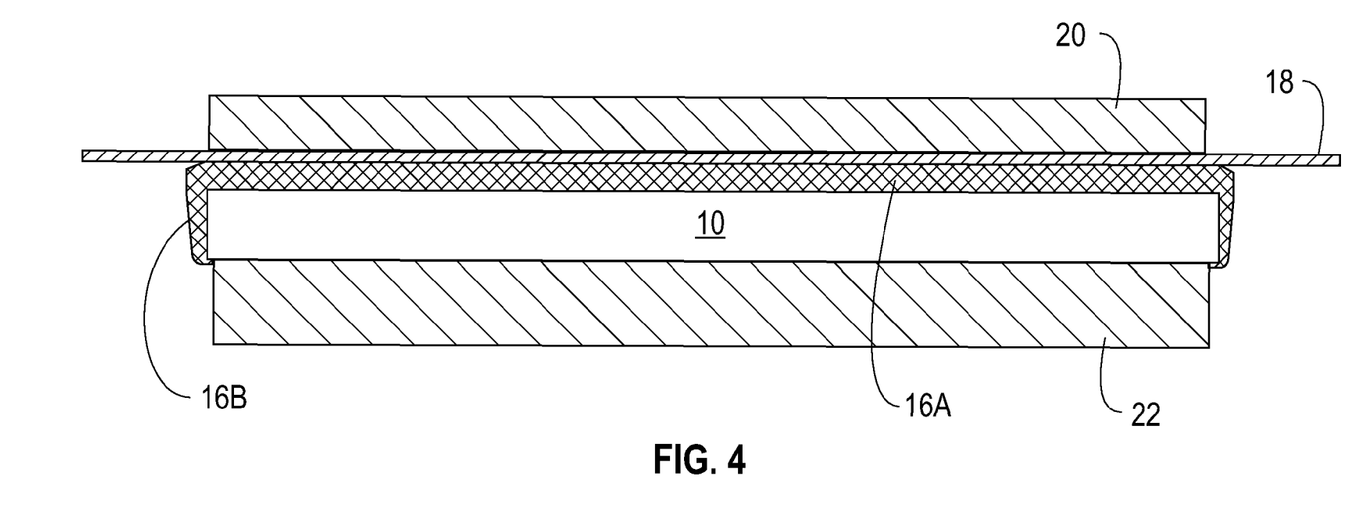
FIG. 4 is a pictorial representation (through a cross sectional view) illustrating the structure of FIG. 3 after applying a spalling inhibitor onto the optional handle substrate, and an optional back plate to the bottommost surface of the base substrate.

Referring to FIG. 4, there is illustrated the structure of FIG. 3 after applying a spalling inhibitor 20 onto the optional handle substrate 18, and an optional back plate 22 to the bottommost surface 14 of the base substrate 10.

The spalling inhibitor 20 is any material that inhibits spontaneous spalling once the self-pinning stressor layer portion 16B of the stressor layer is decoupled from the stressor layer portion 16A of the stressor layer. That is, the spalling inhibitor 20 suppresses mechanical spalling of the base substrate 10. In one embodiment of the present disclosure, the spalling inhibitor 20 is a metal plate, a semiconductor wafer or glass. In another embodiment the spalling inhibitor 20 can be a roller that contacts the instantaneous region where the self-pinning stressor layer portion 16B of the stressor layer is decoupled from the stressor layer portion 16A of the stressor layer. In the latter embodiment, the decoupling occurs dynamically as the roller is translated across the surface.

The optional back plate 22 that can be employed in the present disclosure may include one of materials mentioned above for the spalling inhibitor 20. In another embodiment, the optional back plate 22 may be composed of a magnetic material.

In some embodiments, the optional back plate 22 and the spalling inhibitor 20 are elements of a spalling inhibitor device, e.g., two-piece clamp, which serves to hold the stressor layer portion 16A of the stressor layer in place when the self-pinning portion 16B of the stressor layer is decoupled therefrom.

In one embodiment, the spalling inhibitor 20 that can be employed in the present disclosure has a thickness from 50 µm to several cm. In another embodiment, the spalling inhibitor 20 that can be employed in the present disclosure has a thickness from 100 µm to 1 mm.

In one embodiment, the optional back plate 22 that can be employed in the present disclosure has a thickness from 50 µm to several cm. In another embodiment, the optional back plate 22 that can be employed in the present disclosure has a thickness from 500 µm to 5 mm.

The spalling inhibitor 20 and the optional back plate 22 may be applied to the structure shown in FIG. 3 by hand or by any suitable mechanical means.

Figure 5:
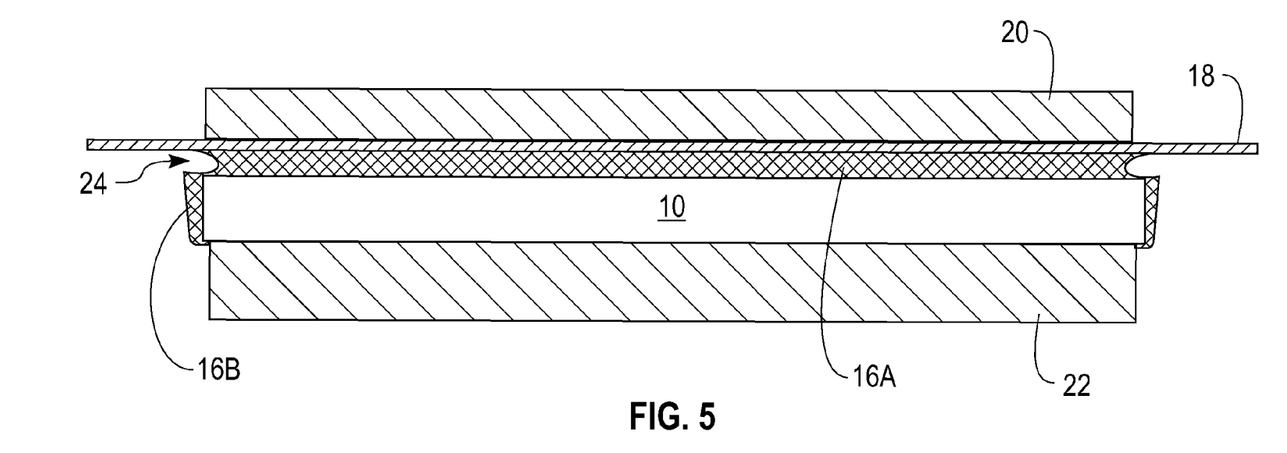
FIG. 5 is a pictorial representation (through a cross sectional view) illustrating the structure of FIG. 4 after releasing (i.e., decoupling) the self-pinning stressor layer portion of the stressor layer from the stressor layer portion.

Referring to FIG. 5, there is illustrated the structure of FIG. 4 after releasing the self-pinning stressor layer portion 16B of the stressor layer from the stressor layer portion 16A. As shown in FIG. 5, a gap 24 is formed between the stressor layer portion 16A and the remaining self-pinning layer portion 16B.

In one embodiment of the present disclosure, the releasing of the self-pinning stressor layer portion 16B of the stressor layer from the stressor layer portion 16A can be conducted using a laser such as, for example, Q-switched diode pumped solid state lasers. In another embodiment of the present disclosure, the releasing of the self-pinning stressor layer portion 16B of the stressor layer from the stressor layer portion 16A can be conducted using a chemical etch such as, for example, nitric acid ($HNO_3$), sulphuric acid ($H_2SO_4$), hydrochloric acid (HCl) or other acids and mixtures thereof. In another embodiment of the present disclosure, the releasing of the self-pinning stressor layer portion 16B of the stressor layer from the stressor layer portion 16A can be conducted using grinding or polishing.

Figure 6:
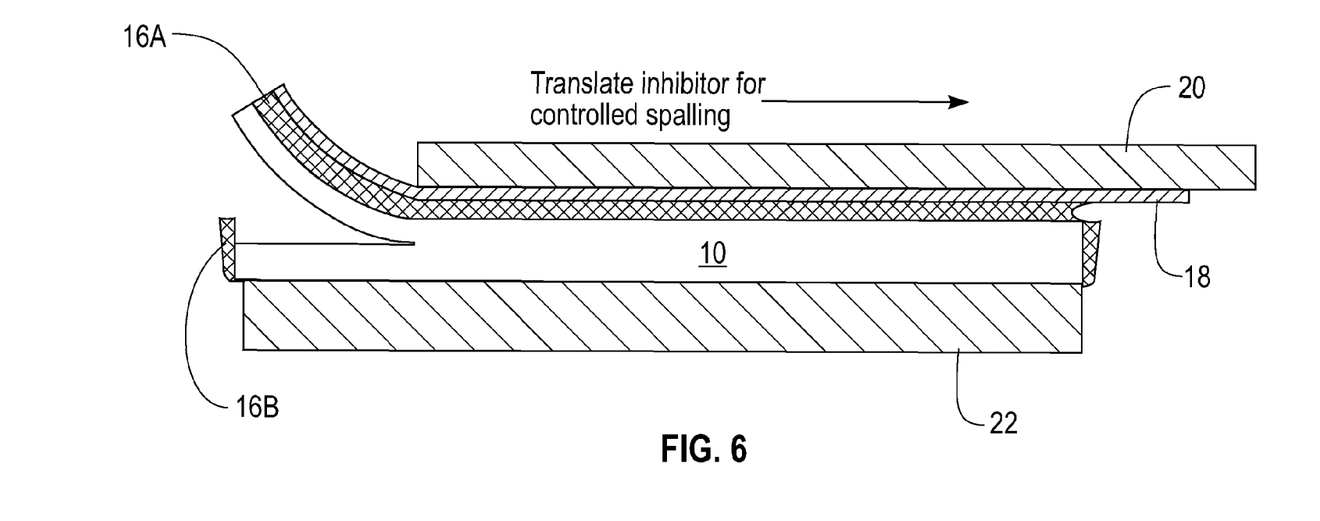
FIG. 6 is a pictorial representation (through a cross sectional view) illustrating the structure of FIG. 5 during spalling.

Referring to FIG. 6, there is illustrated the structure of FIG. 5 during spalling. Specifically, FIG. 6 illustrates the structure during the displacement of the spalling inhibitor 20 from the structure. As shown, the spalling inhibitor 20 is moved across the surface of the structure in a manner that initiates crack formation and crack propagation in one region within the base substrate 10. After the gap is formed and during the displacing of the spalling inhibitor 20, spalling initiates within the base substrate 10 because of the strain induced within the base substrate 10 by the stressor layer portion 16A.

In one embodiment, the displacement of the spalling inhibitor 20 from the structure can be performed by hand. In another embodiment of the present disclosure, the displacement of the spalling inhibitor 20 across the structure can be performed by mechanical means.

The spalling process illustrated in FIG. 6 can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly cool up to room temperature by allowing the same to stand at room temperature. Alternatively, the spalled structure can be heated up to room temperature utilizing any heating means.

Figure 7:
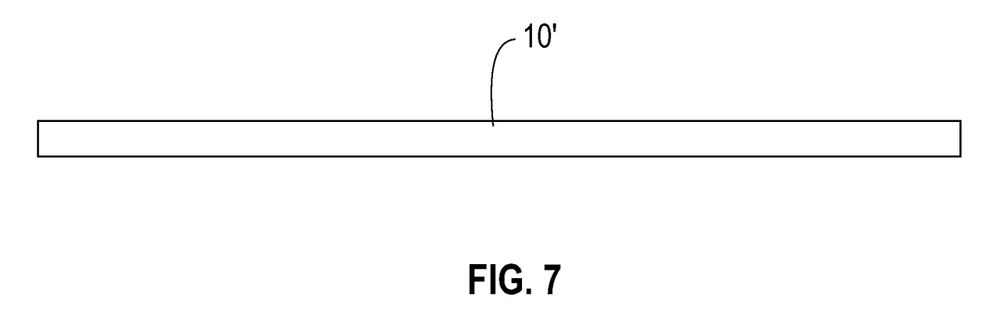
FIG. 7 is a pictorial representation (through a cross sectional view) illustrating the structure of FIG. 6 after spalling and removal of the material layers from atop a spalled portion of the base substrate.

Referring to FIG. 7, there is illustrated the structure of FIG. 6 after spalling and removing the stressor layer portion 16A, optional handle substrate 18 and, if present optional metal-containing adhesion layer from a spalled portion 10' of the base substrate. The optional handle substrate 18 and the stressor layer portion 16A and the optional metal-containing adhesion layer can be removed from the spalled portion 10' of the base substrate utilizing conventional techniques well known to those skilled in the art. For example, and in one embodiment, aqua regia (HNO$_3$/HCl) can be used for removing the optional handle substrate 18, the stressor layer portion 16A and the optional metal-containing adhesion layer from the spalled portion 10' of the base substrate. In another example, UV or heat treatment is used to remove the optional handle substrate 18, followed by a chemical etch to remove the stressor layer portion 16B, followed by a different chemical etch to remove the optional metal-containing adhesion layer. Similar methods could be used to remove the remaining portion of the self-pinning stressor layer portion 16B from the sidewalls of the remaining base substrate that was located beneath the spalled portion 10' of the base substrate.

The thickness of the spalled portion 10' of the base substrate shown in FIG. 7 varies depending on the material of the stressor layer portion 16A and the material of the base substrate 10 itself. In one embodiment, the spalled portion 10' of the base substrate has a thickness of less than 100 microns. In another embodiment, the spalled portion 10' of the base substrate has a thickness of less than 50 microns.

While the present disclosure has been particularly shown and described with respective to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for controlled layer transfer comprising:
providing a stressor layer to a base substrate, said stressor layer having a stressor layer portion located atop an upper surface of the base substrate and a self-pinning stressor layer portion located adjacent each sidewall edge of the base substrate;
applying a spalling inhibitor atop the stressor layer portion of the stressor layer;
decoupling the self-pinning stressor layer portion of the stressor layer from the stressor layer portion;
spalling a portion of the base substrate beneath the stressor layer portion, wherein said spalling includes displacing the spalling inhibitor from atop the stressor layer portion; and
removing the stressor layer portion from atop a spalled portion of the base substrate.

2. The method of claim 1, wherein the base substrate has a fracture toughness that is less than the stressor layer.

3. The method of claim 2, wherein the base substrate comprises a semiconductor material.

4. The method of claim 1, wherein the stressor layer portion and the self-pinning stressor layer portion are of unitary construction and are comprised of a same stressor material.

5. The method of claim 1, wherein the stressor layer portion and the self-pinning stressor layer portion are separate components and are comprised of a different stressor material.

6. The method of claim 1, wherein the stressor layer portion has a critical thickness and stress value that causes spalling mode fracture to occur in a portion of the underlying base substrate once decoupled from the self-pinning stressor layer portion and after displacing the spalling inhibitor.

7. The method of claim 1, wherein the self-pinning stressor layer portion has a sub-critical thickness and stress value, and said self-pinning stressor layer portion holds the stressor layer portion down atop the upper surface of base substrate until after said decoupling.

8. The method of claim 1, further comprising forming a metal-containing adhesion layer between the stressor layer portion and the self-pinning layer portion of the stressor layer.

9. The method of claim 1, wherein the stressor layer portion and the self-pinning layer portion of the stressor layer each comprise a metal, a polymer, a spalling inducing tape or any combination thereof.

10. The method of claim 1, further comprises forming a handle substrate between the stressor layer portion of the stressor layer and the spalling inhibitor.

11. The method of claim 1, wherein the spalling inhibitor comprises a metal plate, a semiconductor wafer or glass.

12. The method of claim 1, further comprising applying a back plate abutting a bottommost surface of the base substrate.

13. The method of claim 12, wherein the back plate and the spalling inhibitor are elements of a spalling inhibitor device.

14. The method of claim 12, wherein the back plate comprises a magnetic material.

15. The method of claim 1, wherein the decoupling comprises removing a portion of the self-pinning stressor layer portion adjacent the stressor layer portion utilizing a laser.

16. The method of claim 1, wherein the decoupling comprises removing a portion of the self-pinning stressor layer portion adjacent the stressor layer portion utilizing a chemical etch.

17. The method of claim 1, wherein the decoupling comprises removing a portion of the self-pinning stressor layer portion adjacent the stressor layer portion utilizing grinding or polishing.

18. The method of claim 1, wherein the spalling is performed at room temperature or below room temperature.

19. The method of claim 1, wherein the spalling is performed at a temperature of 77 K or less.

20. The method of claim 1, wherein the removing the stressor layer portion from atop the spalled portion of the base substrate includes contacting the stressor layer portion with a chemical etchant.

21. The method of claim 20, wherein the chemical etchant is aqua regia.

22. The method of claim 1, wherein the spalled portion of the base substrate has a thickness of less than 1000 microns.

23. The method of claim 1, wherein the stressor layer portion and the self-pinning stressor layer portion are both comprised of Ni.

24. The method of claim 1, wherein said spalling inhibitor is a roller.

\* \* \* \* \*